(12) United States Patent
Endo et al.

(10) Patent No.: US 8,925,190 B2
(45) Date of Patent: Jan. 6, 2015

(54) ELECTRONIC COMPONENT MOUNTING DEVICE AND AN OPERATION PERFORMING METHOD FOR MOUNTING ELECTRONIC COMPONENTS

(75) Inventors: Tadashi Endo, Yamanashi (JP); Hiroshi Ogata, Yamanashi (JP); Tomohiro Kimura, Yamanashi (JP); Takaaki Yokoi, Yamanashi (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 239 days.

(21) Appl. No.: 13/581,845

(22) PCT Filed: Jul. 27, 2011

(86) PCT No.: PCT/JP2011/004240
§ 371 (c)(1),
(2), (4) Date: Aug. 30, 2012

(87) PCT Pub. No.: WO2012/056617
PCT Pub. Date: May 3, 2012

(65) Prior Publication Data
US 2012/0317804 A1    Dec. 20, 2012

(30) Foreign Application Priority Data

Oct. 27, 2010  (JP) ................................. 2010-240466

(51) Int. Cl.
*H05K 3/30*      (2006.01)
*H05K 13/04*     (2006.01)

(52) U.S. Cl.
CPC ........ *H05K 13/0452* (2013.01); *H05K 13/0413* (2013.01)
USPC .................. 29/832; 29/703; 29/739; 29/740; 29/831; 29/469; 438/14; 438/107; 439/607.07; 439/607.09; 700/108; 700/109; 700/110; 700/121

(58) Field of Classification Search
USPC ........... 29/703, 739, 740, 742, 743, 832, 833, 29/834, 836; 438/14, 107; 439/607.07, 439/607.09; 700/108–110, 121
See application file for complete search history.

(56) References Cited

U.S. PATENT DOCUMENTS 6,441,386 B2 *  8/2002  Sakaguchi ............... 250/559.29
7,058,216 B2 *  6/2006  Kawada ........................ 382/146
(Continued)

FOREIGN PATENT DOCUMENTS

JP     2000-299597 A      10/2000
JP     2002111288 A   *   4/2002
(Continued)

OTHER PUBLICATIONS

International Search Report for PCT/JP2011/004240 dated Sep. 13, 2011.

*Primary Examiner* — Paul D Kim
(74) *Attorney, Agent, or Firm* — Pearne & Gordon LLP (57) ABSTRACT

It is intended to provide an electronic component mounting device and an operation performing method for mounting electronic components so that both the operation quality and the productivity can be improved. In operation performing procedures, when an electronic component belongs to the first division, an operating head is made to move up and down based on an approximate operation position height derived from an approximate curved surface of the top surface of a board which is calculated by using the height measurement result obtained by measuring a plurality of height measuring points on the surface of the board, and when the electronic component belongs to the second division, the operating head is made to move up and down based on an individual operation position height obtained by individually measuring the board height at the operation position.

4 Claims, 9 Drawing Sheets

(56) References Cited

U.S. PATENT DOCUMENTS

| | | | |
|---|---|---|---|
| 8,240,543 B2* | 8/2012 | Nishi et al. | 228/103 |
| 2009/0014501 A1* | 1/2009 | Nishi et al. | 228/103 |
| 2009/0125141 A1 | 5/2009 | Noda et al. | |
| 2010/0222226 A1* | 9/2010 | Ishihara et al. | 506/9 |

FOREIGN PATENT DOCUMENTS

| | | |
|---|---|---|
| JP | 2006-162554 A | 6/2006 |
| JP | 2006-196819 A | 7/2006 |
| WO | 2007/063763 A1 | 6/2007 |

* cited by examiner

ELECTRONIC COMPONENT MOUNTING DEVICE AND AN OPERATION PERFORMING METHOD FOR MOUNTING ELECTRONIC COMPONENTS

TECHNICAL FIELD

The present invention relates to an electronic component mounting device which performs operations to mount electronic components on a board and an operation performing method for mounting electronic components on a board.

BACKGROUND ART

An electronic component mounting line that produces a mounted board by mounting electronic components on the board is formed by coupling together a plurality of electronic component mounting devices which have different operational functions, such as a coating device that coats a board with a viscous material like paste or adhesive that is used to bond electronic components with the board or a component mounting device that loads electronic components on a coated board. These electronic component mounting devices are configured so that predetermined electronic component mounting operations are performed by the respective electronic component mounting devices, such as a component loading operation and a viscous material coating operation which are performed by operating heads provided in the respective electronic component mounting devices, such as a component mounting head and a coating head, on the board while the board is conveyed from an upstream position to a downstream position.

However, in recent years, with the development of the downsizing and multifunctionalization of electronic devices, mounted boards incorporated in the electronic devices become downsized and thin which requires high density and high precision mounting, and warp deformation of the boards becomes likely to occur. For example, on the surface of a board such as a resin board which is thin and lacks rigidity, there may be complicated warp deformation which is locally different.

Therefore, in a coating device which coats resin to bond electronic components to the surface of a board, because the coating height of the surface of the board and the coating nozzle varies with each of the operation sites due to the warp deformation of the board, normal quantity of coating and coating shape cannot be ensured, which is a cause of poor mounting in following procedures. Further, in a mounting device which loads a semiconductor package, when the semiconductor package is loaded on the board which just produces complicated warp deformation, a soldering bump may be not normally bonded to an electrode of the board by being soldered, poor conduction or poor bonding such as low bonding strength is likely to occur.

As a measure to prevent the trouble due to the warp deformation of the board as much as possible, a technique to correct the operation height at an operation position is known (for example, referring to patent document 1), in which a curved surface model is prepared that approximates the shape of the board with a mathematical formula beforehand from a height measurement result on a plurality of measurement sites set on the surface of the board, and the curved surface model is used when an operation is performed. In the example shown in the patent document 1, in case that a measurement site is located at a notch part, the influence of the increase and decrease of local displacement amount due to the discontinuity of the surface of the board on the assumption of the curved surface model can be prevented by setting additional measurement sites other than the normal measurement sites on the surface of the board.

RELATED ART DOCUMENT

Patent Document

Patent document 1: International Publication No. 2007/063763

SUMMARY OF THE INVENTION

Problems to be Solved by the Invention

However, in the conventional art to approximate the warp deformation of the surface of the board with the curved surface model that is shown by a mathematical formula including the example shown in the above-mentioned patent document, due to the increase of precision level required for electronic components which are operation objects, the following problems occur. In other words, in the high precision and high density mounting as described before, compared with conventional devices, operation heights such as component mounting height or coating height are required to be controlled more precisely. However, because the curved surface model that is obtained by measuring the surface of the board beforehand is actually an approximate model obtained with a mathematical formula, when the model is applied to a real board having irregularity locally, the right operation height of the surface of the board is not shown as an operation position, and good operation quality cannot be secured.

Further, to prevent the defect due to local deformation of the board, it may be considered to perform height measurements individually for each of the operation positions corresponding to the respective electronic components, but when a large number of components are to be mounted on the board, a long time is needed for the height measurements, and a significant drop of the productivity cannot be avoided. Thus, in the conventional electronic component mounting devices and operation performing methods for mounting electronic components, there is a problem that it is difficult to improve both the productivity and the operation quality such as the component mounting quality to and the resin coating quality.

Thus, the invention is intended to provide an electronic component mounting device and an operation performing method for mounting electronic components so that both the operation quality and the productivity can be improved.

Means for Solving the Problems

An electronic component mounting device of this invention performs a predetermined operation for mounting each of electronic components on a board on which the electronic components are to be mounted, comprising:

an operating performing mechanism which comprises an operating head that performs the operation and which performs the operation by making the operating head move up and down to operation positions where the operation is performed on the board;

a height measuring device which measures a height position on the top surface of the board at any measurement point;

an operation information storage part which, for each of the operation positions, stores operation data which make operation position information indicating position coordinates in the board of the operation positions to correspond to height precision division information that divide height precision required for up and down movements of the operating head in the operation into a first division which indicates a normal height precision and a second division which indicates that a high height precision is required based on the type of electronic components beforehand; and an operation control part which makes the operating head to perform the operation by reading out the operation data from the operation information storage parts and controlling the operation performing mechanism based on the operation data;

wherein, when the electronic component which is an operation object belongs to the first division, the operation control part controls the operation performing mechanism to make the operating head to move up and down based on an approximate operation position height derived from an approximate curved surface of the top surface of the board which is calculated by using a height measurement result obtained on a plurality of height measuring points on the top surface of the board, and when the electronic component which is an operation object belongs to the second division, the operation control part controls the operation performing mechanism to make the operating head to move up and down based on an individual operation position height obtained when the height measuring device individually measures the board height at the operation position.

An operation performing method of this invention for mounting electronic components which performs a predetermined operation for mounting each of electronic components on a board on which the electronic components are to be mounted by making an operating head which is included in an operation performing mechanism to move up and down to operation positions where the operation is performed on the board, comprising:

an operation information storing procedure which, for each of the operation positions, makes operation data which make operation position information indicating position coordinates in the board of the operation positions to correspond to height precision division information that divide height precision required for up and down movements of the operating head in the operation into a first division which indicates a normal height precision and a second division which indicates that a high height precision is required based on the type of electronic components to be stored beforehand; and an operation performing procedure which makes the operating head to perform the operation by reading out the stored operation data and controlling the operation performing mechanism based on the operation data;

wherein in the operation performing procedures, when the electronic component which is an operation object belongs to the first division, the operating head is made to move up and down based on an approximate operation position height derived from an approximate curved surface of the top surface of the board which is calculated by using the height measurement result obtained on a plurality of height measuring points on the top surface of the board, and when the electronic component which is an operation object belongs to the second division, the operating head is made to move up and down based on an individual operation position height obtained by individually measuring the board height at the operation position.

Effects of the Invention

According to the present invention, the height precision division information that divide the height precision required for up and down movements of operating heads into the first division which indicates a normal height precision and the second division which indicates that a high height precision is required based on the type of electronic components are stored as operation data beforehand, and in the operation performing procedures, when the electronic component which is an operation object belongs to the first division, the operating head is made to move up and down based on an approximate operation position height derived from an approximate curved surface of the top surface of the board which is calculated by using the height measurement result obtained on a plurality of height measuring points on the top surface of the board, and when the electronic component which is an operation object belongs to the second division, the operating head is made to move up and down based on an individual operation position height obtained by individually measuring the board height at the operation position. Therefore, the operating head can be made to move up and down based on the precision to be required for the electronic component which is an object, and both the operation quality and the productivity can be improved.

BRIEF DESCRIPTION OF THE FIGURES

FIGS. 2 ($a$) to ($c$) are figures which illustrate structures and functions of an electronic component mounting device of the embodiment of the present invention.

FIGS. 3 ($a$) to ($d$) are figures which illustrate structures and functions of an electronic component mounting device of the embodiment of the present invention.

FIGS. 7 ($a$) to ($d$) are figures which illustrate height precision divisions of electronic components in the electronic component mounting devices of the embodiment of the present invention.

FIGS. 8 ($a$) and ($b$) are figures which illustrate an approximate operation position height and an individual operation position height in the electronic component mounting devices of the embodiment of the present invention.

EMBODIMENTS OF THE INVENTION

Figure 1:
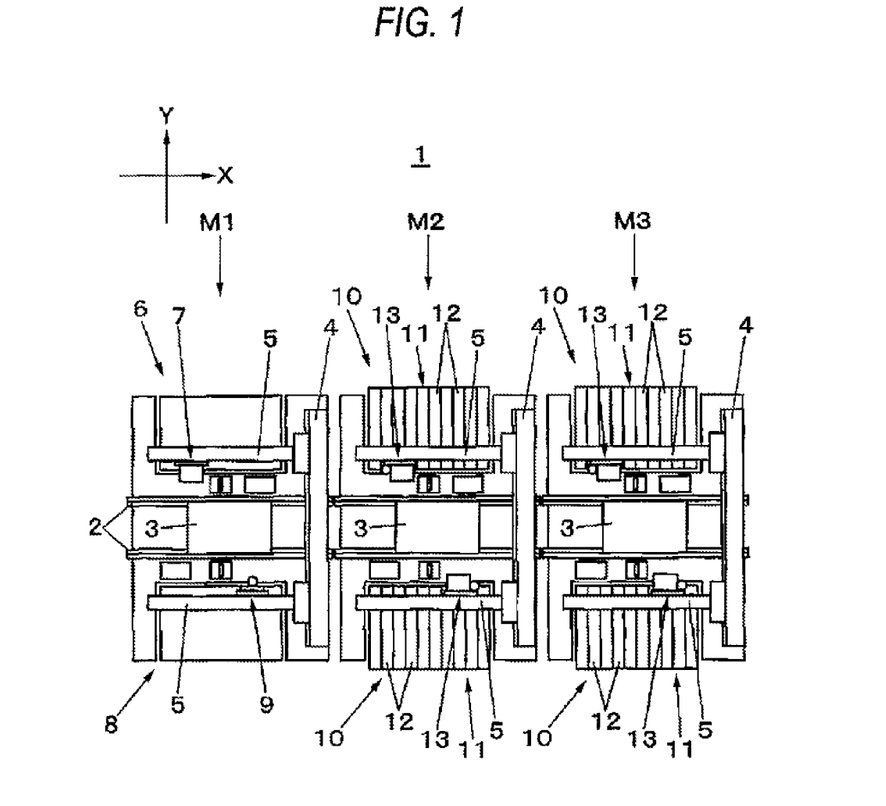
FIG. 1 is a plane view which shows a structure of an electronic component mounting line of an embodiment of the present invention.

At first, a structure of an electronic component mounting line 1 is described with reference to FIG. 1. The electronic component mounting line 1 is formed by coupling a plurality of electronic component mounting devices (M1, M2 and M3) in series. These devices have functions of performing predetermined operations for mounting every electronic component on a board 3 on which the electronic components are to be mounted. Under the collective control of an administrative computer 30 (referring to FIG. 4), the respective devices sequentially perform operations for mounting components on the same board 3. In the electronic component mounting line 1, the board 3 on which paste for solder bonding is printed by an upstream device is imported to the inspecting, measuring and coating device M1 located at an upstream position (left side in the figure). The board 3 is sequentially conveyed in the X direction (board conveying direction) of the electronic component mounting line 1, and becomes an operation object of the component mounting devices M2 and M3 which are located at downstream positions. In the embodiment, the board 3 is a production object such as a thin resin board for which warp deformation is likely to be produced.

Figure 2:
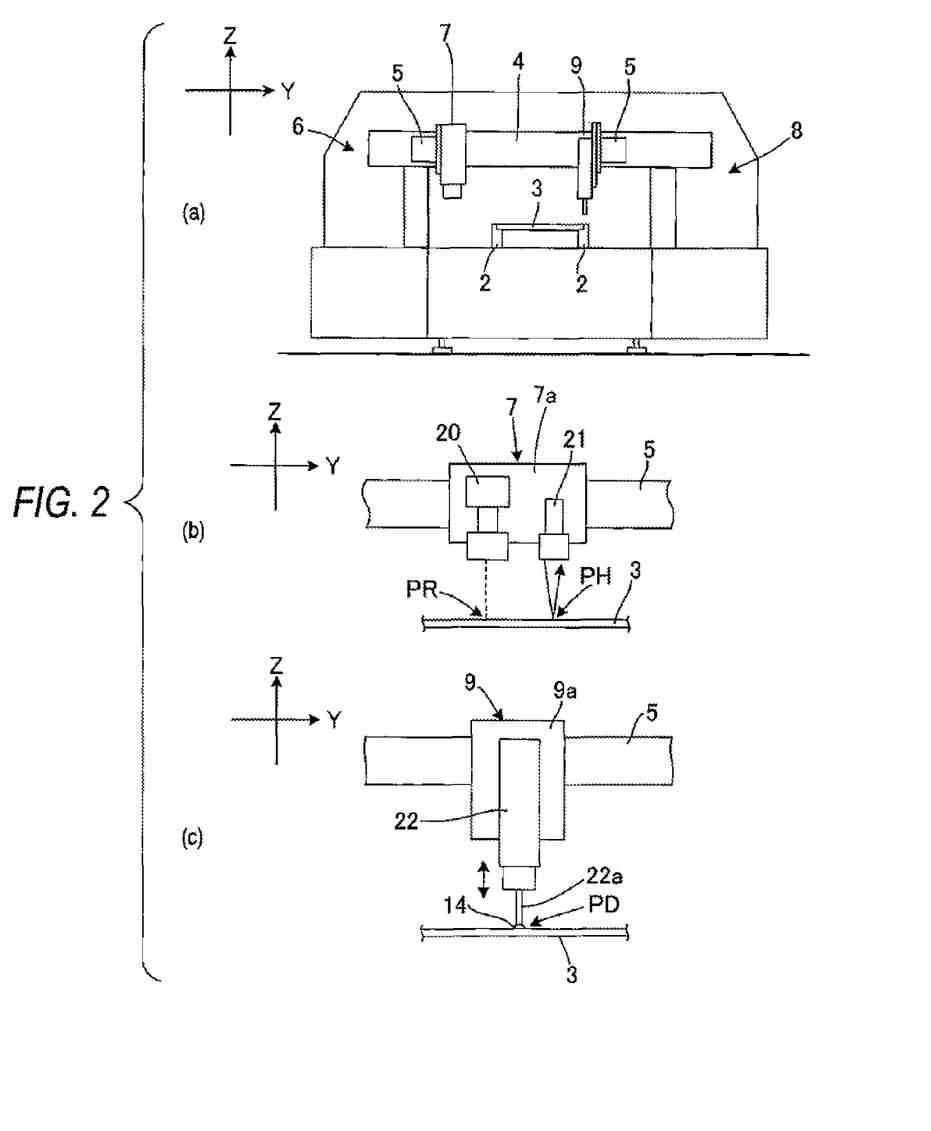

Then, structures of the respective devices in the electronic component mounting line 1 are described. The inspecting, measuring and coating device M1 is formed by arranging a resin coating part 8 which performs an operation of coating resin adhesive on the board 3 on which cream solder for solder bonding is printed by an upstream device and an inspecting and measuring part 6 which performs an inspecting operation before and after the coating operation and performs a height measurement of the top surface of the board 3 which is the operation object so that a board conveying mechanism 2 is hold between the resin coating part 8 and the inspecting and measuring part 6. A Y axis movable table 4 and two X axis movable tables 5 which are movable in the Y direction along the Y axis movable table 4 are provided in the inspecting, measuring and coating device M1. As shown in FIG. 2 (a), an inspecting and measuring head 7 is mounted to the X axis movable table 5 of the inspecting and measuring part 6, and a coating head 9 is mounted to the X axis movable table 5 of the resin coating part 8.

As shown in FIG. 2 (b), an imaging camera 20 for inspection and a height measuring device 21 such as a laser displacement meter are installed on a holding plate 7a of the inspecting and measuring head 7. The imaging camera 20 and the height measuring device 21 can move to any positions above the board 3 by driving the Y axis movable table 4 and the X axis movable table 5. The imaging camera 20 images a recognition position PR of any inspection object on the top surface of the board 3. A predetermined inspection is performed by recognizing the imaging result. The height measuring device 21 is located above any height measuring point PH which is set on the top surface of the board 3, and performs height measurement of the height measuring point PH. Therefore, height measurement data which indicates the height of the top surface of the board 3 are acquired. In the above structure, the Y axis movable table 4, the X axis movable table 5, the imaging camera 20 and the height measuring device 21 forms an inspecting and measuring mechanism 44 (referring to FIG. 4).

Figure 8:
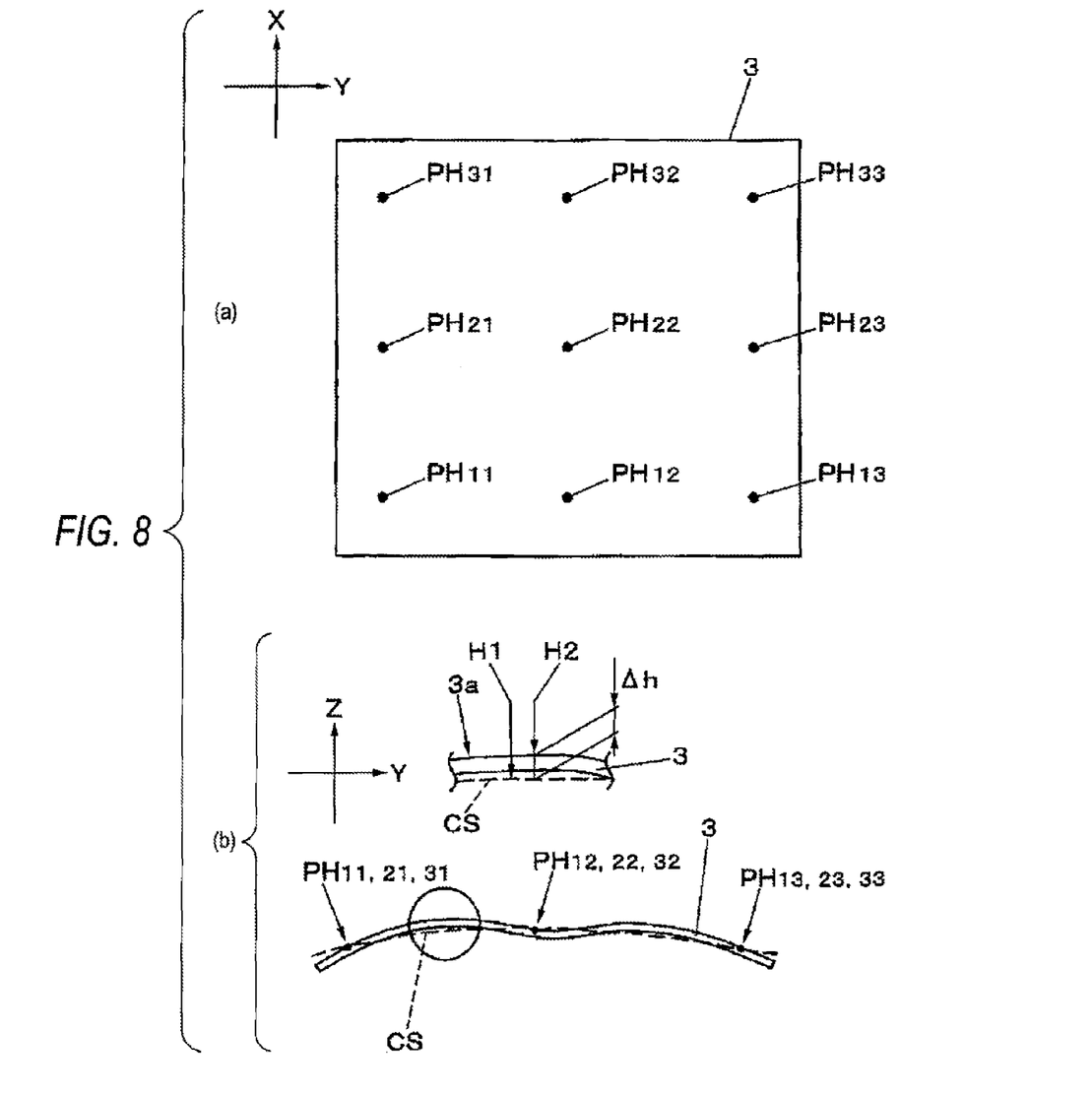

Among the electronic component mounting devices that the electronic component mounting line 1 includes, the inspecting and measuring part 6 placed in the inspecting, measuring and coating device M1 is a height measuring device which is provided in the electronic component mounting device located at the most upstream position. In an operating method for mounting electronic components that is shown in the present embodiment, a height measurement is performed on a plurality of height measuring points on the top surface of the board 3 which is likely to produce warp deformation by the height measuring device, and an approximate curved surface which approximately represents the shape of the warp deformation of the top surface of the board 3 is calculated by using the obtained height measurement result (referring to FIGS. 8 (a) and (b)). When an operation is performed by the inspecting, measuring and coating device M1 or the component mounting devices M2 and M3, an operation position height of the board 3 in the operation position is derived approximately based on the approximate curved surface, and an operating head is made to move up and down based on the approximate operation position height.

As shown in FIG. 2 (c), a dispenser 22 is held in a vertically movable manner on a holding plate 9a of the coating head 9. The dispenser 22 has a function of discharging resin adhesive 14 for electronic component bonding from a coating nozzle 22a which is installed at the bottom of the dispenser 22. The coating head 9 can move to any position of the board 3 by driving the Y axis movable table 4 and the X axis movable table 5. The resin adhesive 14 is coated on a coating position PD on the board 3 by making the coating nozzle 22a drop and discharging the resin adhesive 14 for electronic component bonding. The Y axis movable table 4, the X axis movable table 5 and the dispenser 22 forms a coating mechanism 45 (referring to FIG. 4).

Figure 3:
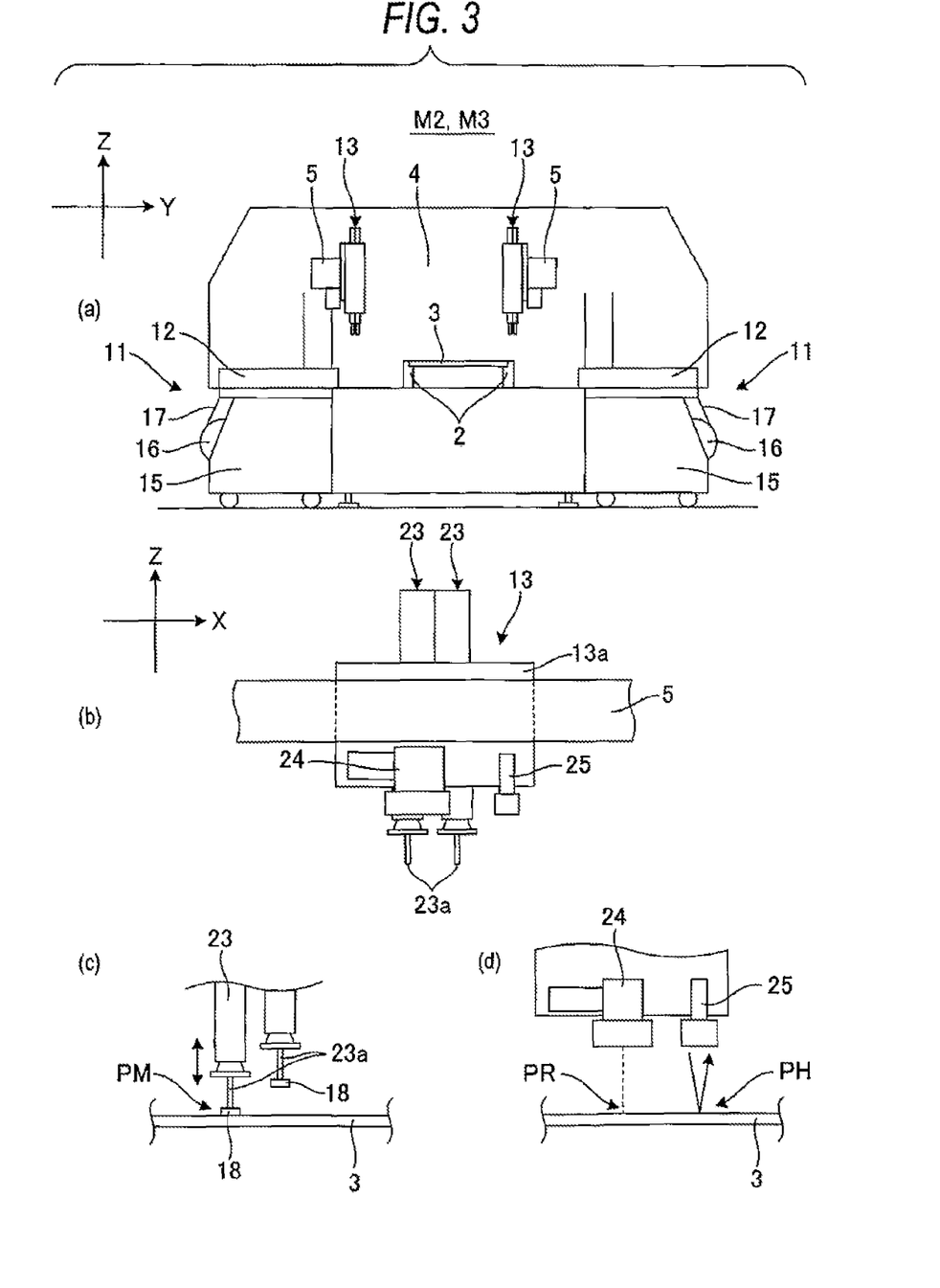

The component mounting devices M2 and M3 are formed by arranging two component mounting parts 10 so that the board conveying mechanism 2 is held between the two component mounting parts 10. The component mounting part 10 has functions of performing an component mounting operation to mount an electronic component on the board 3 which is in a state that the cream solder for solder bonding is printed in an upstream device and the coating operation of the resin adhesive 14 is performed, and measuring the height of the top surface of the board 3 which becomes an operation object. A Y axis movable table 4 and two X axis movable tables 5 which are movable in the Y direction along the Y axis movable table 4 are provided in each of the component mounting devices M2 and M3. As shown in FIG. 3 (a), a mounting head 13 is mounted to each of the X axis movable tables 5.

Component supply parts 11 are disposed at both sides of the board conveying mechanism 2 opposite to each of the mounting heads 13. A plurality of tape feeders 12 are placed in the component supply part 11 so that the tape feeders are held in parallel in a carriage 15. A supply reel 16 which winds a carrier tape 17 into the carriage 15 is installed to each of the tape feeder 12. The carrier tape 17 drawn out from the supply reel 16 is sent to a pickup position by each of the tape feeders 12 and by the mounting head 13.

The mounting head 13 is a multiple units type head which is formed by holding a plurality of unit transferring heads 23 on a holding plate 13a. An adsorbing nozzle 23a for adsorbing and holding an electronic component 18 is installed at the lower end of each of the unit transferring heads 23. The mounting head 13 takes out an electronic component from the tape feeder 12 by making the mounting head 13 move to the component supply part 11 and making the adsorbing nozzle 23a move downwards to the pickup position of the tape feeder 12. In this state, the mounting head 13 is moved towards the top surface of the board 3 by driving the Y axis movable table 4 and the X axis movable table 5. In this way, as shown in FIG. 3 (c), the held electronic component 18 is mounted on the board 3 at a set component mounting position PM by making the adsorbing nozzle 23a move downwards. The Y axis movable table 4, the X axis movable table 5 and the mounting head 13 forms a component mounting mechanism 54 (referring to FIG. 4).

A board recognition camera 24 and a height measuring device 25 such as a laser displacement meter are disposed at the lower part of the holding plate 13a, located below the X axis movable table 5, and are movable integrally with the mounting head 13. As shown in FIG. 3 (d), the board recognition camera 24 images any recognition position PR of the top surface of the board 3 by making the board recognition camera 24 and the height measuring device 25 move to any position above the board 3. The recognition position PR is recognized by recognizing the imaging result. The height measuring device 25 is located above any height measuring point PH which is set on the top surface of the board 3, and performs height measurement of the height measuring point PH. Therefore, height measurement data which indicates the height of the top surface of the board 3 are acquired.

Figure 4:
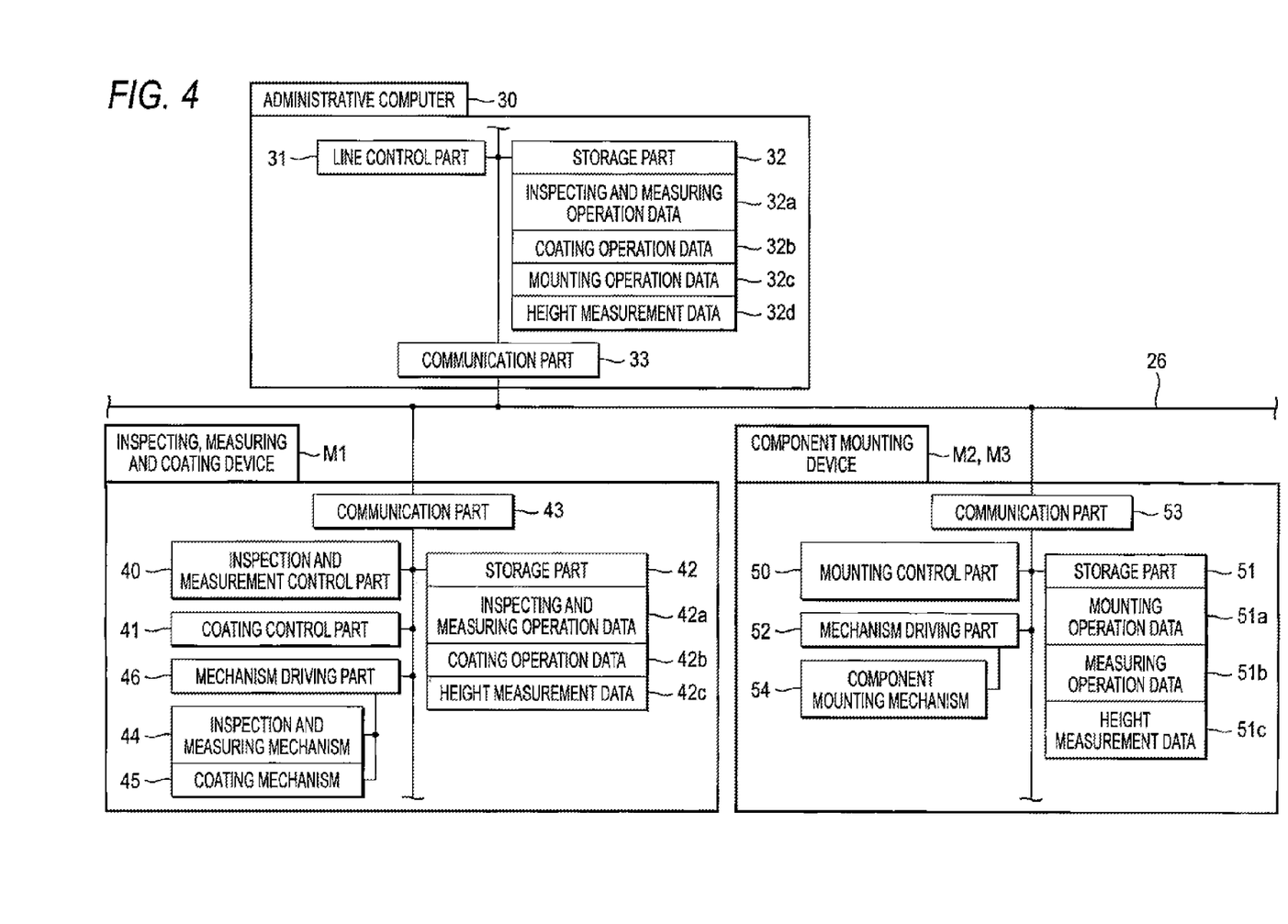
FIG. 4 is a block diagram which shows a structure of a control system of the electronic component mounting line of the embodiment of the present invention.

Next, a structure of a control system is described with reference to FIG. 4. As shown in FIG. 4, the inspecting, measuring and coating device M1 and the component mounting devices M2 and M3 are connected to an administrative computer 30 through a LAN system 26. The inspecting, measuring and coating device M1 and the component mounting devices M2 and M3 are collectively managed by the administrative computer 30. The administrative computer 30 includes a line control part 31, a storage part 32 and a communication part 33. The line control part 31 performs the whole management of operations performed by the respective devices of the electronic component mounting line 1. The storage part 32 stores inspecting and measuring operation data 32a, coating operation data 32b, mounting operation data 32c and height measurement data 32d. These data are data used in operations performed by the inspecting, measuring and coating device M1 and the component mounting devices M2 and M3, which will be described below. The communication part 33 is connected to other devices through the to LAN system 26. The exchange of the above-mentioned respective data is performed among these other devices.

The inspecting, measuring and coating device M1 includes an inspection and measurement control part 40, a coating control part 41, a storage part 42, a communication part 43, an inspecting and measuring mechanism 44, a coating mechanism 45 and a mechanism driving part 46. The inspection and measurement control part 40 drives the inspecting and measuring mechanism 44 by controlling the mechanism driving part 46. In this way, the inspecting operation in which the recognition position PR of the board 3 is imaged by the imaging camera 20 and the measuring operation in which the height of the height measuring point PH of the board 3 is measured by the height measuring device 21 are performed. The coating control part 41 drives the coating mechanism 45 by controlling the mechanism driving part 46. In this way, the coating operation in which the resin adhesive 14 is discharged by the dispenser 22 at the coating position PD of the board 3 is performed.

Inspecting and measuring operation data 42a, coating operation data 42b and height measurement data 42c are stored in the storage part 42. The inspecting and measuring operation data 42a are operation data which the imaging camera 20 uses to perform the inspecting operation and the height measuring device 21 uses to perform the measuring operation. In this way, operation positions which are objects on which the inspection and the measurement are performed are specified. The coating operation data 42b are operation data which the dispenser 22 uses to perform the coating operation. In this way, objects of the coating operation such as coating operation positions and coating amount, which are necessary items for the coating operation, are specified. In addition to a height measurement result measured by the height measuring device 21, the data indicating an approximate curved surface calculated from the height measurement result are included in the height measurement data 42c.

The communication part 43 is connected to other devices through the LAN system 26. The exchange of the above-mentioned respective data is performed among these other devices. Data with the same contents as the inspecting and measuring operation data 32a and the coating operation data 32b stored in the storage part 32 of the administrative computer 30 are sent to the inspecting, measuring and coating device M1 through the communication part 43 and the LAN system 26, and stored in the storage part 42 as the inspecting and measuring operation data 42a and the coating operation data 42b. The height measurement data 42c acquired in the inspecting, measuring and coating device M1 are transmitted to the administrative computer 30 through the LAN system 26, and stored as the height measurement data 32d in the storage part 32. It is also possible that the height measurement data 42c are transmitted from the inspecting, measuring and coating device M1 to the component mounting device M2, and stored in the storage part 32, but not through the administrative computer 30.

The component mounting devices M2 and M3 include a mounting control part 50, a storage part 51, a mechanism driving part 52, a communication part 53 and a component mounting mechanism 54. The mounting control part 50 controls the operations performed by the mounting head 13, namely, the component mounting operation performed by the respective unit transferring heads 23 of the mounting head 13, the board recognition performed by the board recognition camera 24, and the height measurement operation performed by the height measuring device 25. The storage part 51 stores mounting operation data 51a, measuring operation data 51b and height measurement data 51c. The mounting operation data 51a are operation data which the unit transferring head 23 uses to perform the component mounting operation. In this way, objects of the component mounting such as mounting operation positions or the types of the mounted electronic components are specified. The measuring operation data 51b are operation data which the height measuring device 25 uses to perform the measuring operation. The height measurement data 51c includes data indicating a height measurement result acquired by the inspecting, measuring and coating device M1 and an approximate curved surface calculated from the height measurement result and data indicating a height measurement result acquired by the component mounting devices M2 and M3. The mechanism driving part 52 is controlled by the mounting control part 50 and drives the component mounting mechanism 54. The communication part 53 is connected to other devices through the LAN system 26. The exchange of the above-mentioned respective data is performed among these other devices.

In the above structure, the coating head 9 in the inspecting, measuring and coating device M1 and the mounting heads 13 in the component mounting devices M2 and M3 are operating heads which perform predetermined operations for mounting electronic components (resin coating operation and component mounting operations). The coating mechanism 45 and the component mounting mechanism 54 are operation performing mechanisms to perform operations by making these operating heads move up and down to the operation positions where the operations are performed on the board 3. The Y axis movable table 4, the X axis movable table 5 and the height measuring device 21 in the inspecting, measuring and coating device M1 and the Y axis movable table 4, the X axis movable table 5 and the height measuring device 25 in the component mounting devices M2 and M3 are height measuring devices which measure the height position of the top surface of the board 3 at any measurement point.

Figure 5:
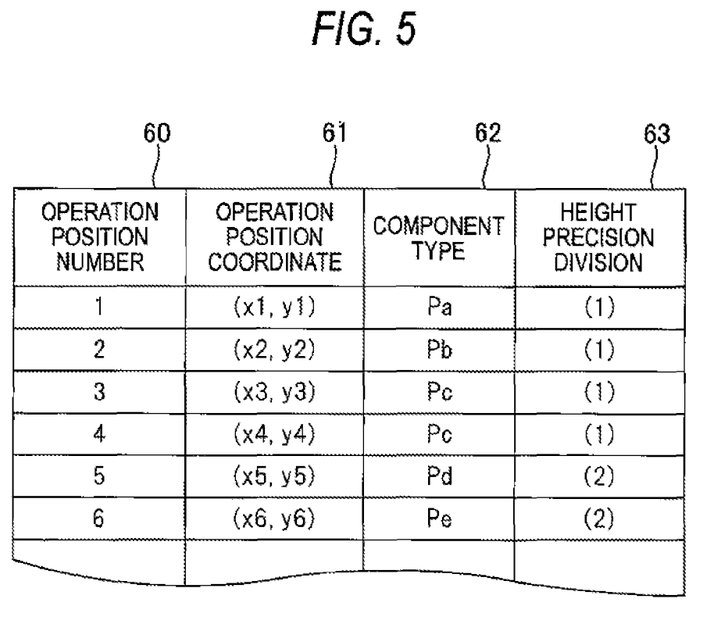
FIG. 5 is a figure which shows data contents of operation data used in the electronic component mounting devices of the embodiment of the present invention.
Figure 6:
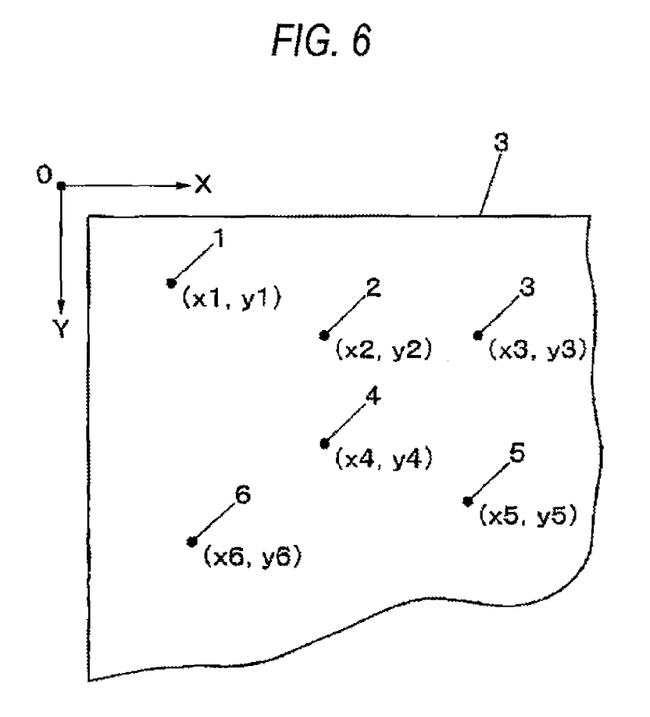
FIG. 6 is a figure which illustrates operation positions of a board in the electronic component mounting devices of the embodiment of the present invention.
Figure 7:
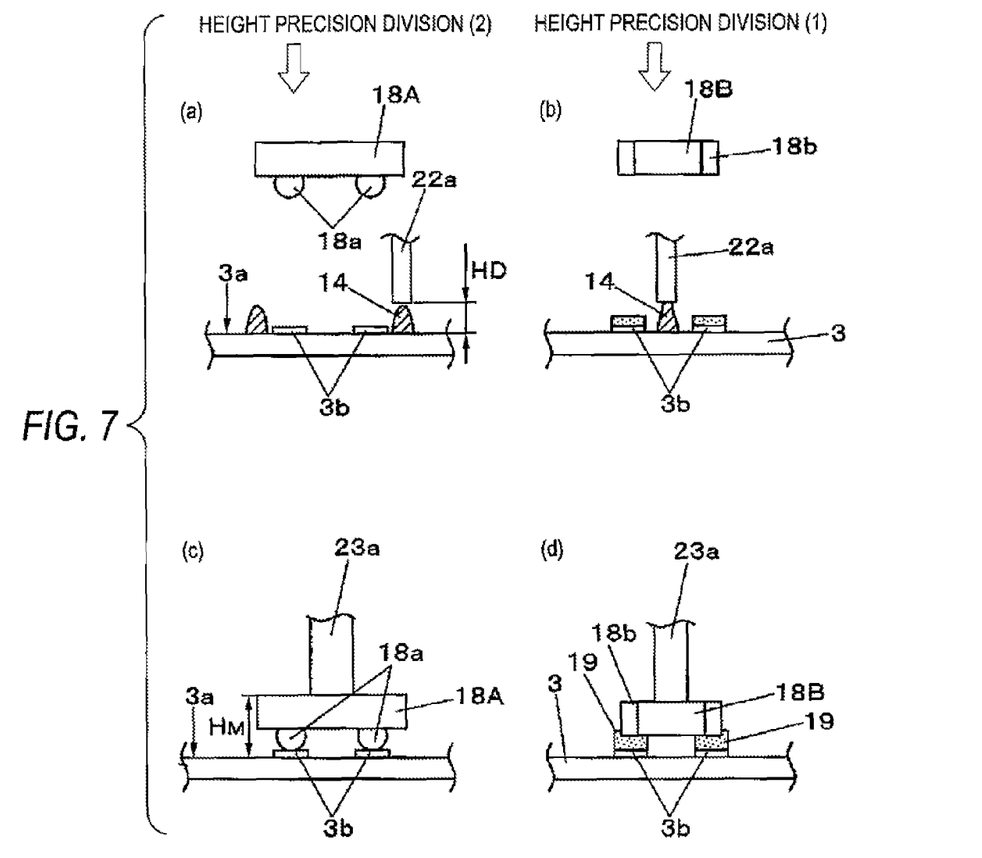

Next, structures of the operation data used in the electronic component mounting devices shown in the present embodiment, namely, the coating operation data 32b and 42b used for the coating operation performed by the coating mechanism 45 in the inspecting, measuring and coating device M1, and the mounting operation data 32c and 51a stored in the storage part 32 and the storage part 51 used for the component mounting operation performed by the component mounting mechanism 54 in the component mounting devices M2 and M3, are described with reference to FIGS. 5, 6 and 7 (*a*) to (*d*).

As shown in FIG. 5, the operation data have a data structure so that an operation position coordinate 61, a component type 62 and a height precision division 63 correspond to an operation position number 60 to individually identify operation positions such as a resin coating position or a component mounting position where operations are performed on one board 3 which is an operation object. The operation position coordinate 61 is operation position information which indicates the X and Y position coordinates in the board 3 of the operation position number 60 as shown in FIG. 6. Therefore, a position in the board 3 of an operation object is specified. A feature point that can be used to identify a position in the board 3 of an electronic component which is an operation object such as the center point of the electronic component or a particular corner point of the electronic component can be selected as the operation position coordinate 61.

The component type 62 shows the type of electronic components corresponding to an operation position. The height precision division 63 prescribes the height precision to be required when an operation is performed by an operating head with an electronic component specified by the component type 62 as an object, namely the height precision of the position where the operating head stops when the operating head drops, by dividing the height precision into a first division (1) and a second division (2). In other words, the height precision division 63 shows height precision division information in which the height precision to be required in the operation for the movement of the operating head which moves up and down is divided into the first division (1) which indicates a normal height precision and the second division (2) which indicates that a high height precision is required, based on the type of the electronic component which is the operation object. The operation data shown in FIG. 5 are formed by making the height precision division information correspond to the above-mentioned operation position information beforehand. The storage part 42 in the inspecting, measuring and coating device M1 and the storage part 51 in the component mounting devices M2 and M3 become operation information storage parts for storing these operation data.

In the inspecting, measuring and coating device M1, the coating control part 41 reads out the coating operation data 42*b* from the storage part 42 which is an operation information storage part, and makes the coating head 9 having the dispenser 22 perform the resin coating operation by controlling the coating mechanism 45 that is an operation performing mechanism based on the coating operation data 42*b*. In the component mounting devices M2 and M3, the mounting control part 50 reads out the mounting operation data 51*a* from the storage part 51 which is an operation information storage part, and makes the mounting head 13 having the unit transferring heads 23 perform the component mounting operation by controlling the component mounting mechanism 54 that is an operation performing mechanism based on the mounting operation data 51*a*. Therefore, the coating control part 41 and the mounting control part 50 become operation control parts that read out the operation data from the operation information storage parts, and makes operating heads perform the operations by controlling the operation performing mechanisms based on these operation data.

Here, the height precision division is described with reference to FIGS. 7 (*a*) to (*d*). As an example of the type of electronic components divided into the first division (1) in the height precision division, there is a rectangular chip-like component 18B at both ends of which terminal portions 18*b* are formed. In a resin coating operation which is performed at a position where the chip-like component 18B is to be mounted, as shown in FIG. 7 (*b*), because the coating operation is to coat a predetermined amount of resin adhesive 14, a high precision is not required for the target position of the coating nozzle 22*a* which moves down. Further, in a component mounting operation in which the chip-like component 18B is an object, as shown in FIG. 7 (*d*), because it is enough to land the chip-like component 18B which is adsorbed and held by the adsorbing nozzle 23*a* on the cream solders 19 which are printed on the electrodes 3*b* beforehand, a high precision is not required for the target position of the adsorbing nozzle 23*a* which moves down.

As an example of the type of electronic components divided into the second division (2) in the height precision division, there is a bump attaching component 18A on the bottom surface of which bumps 18*a* for connection are formed. In a resin coating operation which is performed at a position where the bump attaching component 18A is to be mounted, as shown in FIG. 7 (*a*), to reinforce the corners of the bump attaching component 18A, the resin adhesive 14 is intended to be coated to a predetermined height HD from the top surface 3*a*. At this time, because the predetermined height HD is prescribed by the height of the bump attaching component 18A, a high precision is required for the target position of the coating nozzle 22*a* which moves down.

Further, in a component mounting operation in which the bump attaching component 18A is an object, as shown in FIG. 7 (*c*), it is necessary to make the electrodes 3*b* of the bump attaching component 18A which is adsorbed and held by the adsorbing nozzle 23*a* abut on the bumps 18*a* with a prescribed amount of pressing force. Therefore, when the component is mounted, it is demanded to make the adsorbing nozzle 23*a* to move down with high precision until a height position of the mounting height HM of the bump attaching component 18A including the bumps 18*a* from the top surface 3*a*, and a high precision is required for the target position of the coating nozzle 22*a* which moves down.

Thus, in the electronic component mounting line 1 shown in the present embodiment, it is judged which of the first division (1) and the second division (2) each of the electronic components 18 to be mounted on a board 3 which is likely to produce warp deformation belongs to beforehand, and the divisions are specified in the height precision division 63 of the operation data. When operations in which these electronic components are objects are performed in the inspecting, measuring and coating device M1, and the component mounting devices M2 and M3, the coating control part 41 and the mounting control part 50, which are operation control parts, use a different standard of the operation position height when operating heads are made to move up and down, based on that the height precision division of the electronic component 18 which is an operation object belongs to which of the first division (1) and the second division (2). In other words, an approximate operation position height derived from an approximate curved surface of the top surface of the board 3 calculated from a height measurement result performed on the board 3 beforehand and an individual operation position height that is obtained by individually measuring the board height are used respectively.

An approximate curved surface of the top surface of the board 3 is described. As shown in FIG. 8 (*a*), a plurality of height measuring points PHij (here, i=1 to 3, j=1 to 3) are set in a matrix form on the top surface of the board 3. These height measuring points PHij became objects of the height measurement performed by the height measuring device 21 of the inspecting and measuring head 7 in the inspecting, measuring and coating device M1, and an approximate curved surface CS which is approximate to the shape of the top surface of the board 3 is calculated with a predetermined mathematical formula by using the height measurement result provided by the height measurement, as shown in FIG. 8 (*b*). When the approximate curved surface is calculated, an approximate form can be suitably selected based on the precision level to be required. In the simplest form, the warp deformation in the direction (X direction in the example shown in FIGS. 8 (*a*) and (*b*)) in the plane of the board 3 in which there is little warpage is ignored, and the approximate curved surface CS becomes a section shape in the Y direction of the board 3 which is approximated with a predetermined mathematical formula.

When the height precision division of an electronic component 18 which is an operation object is the first division (1), the coating mechanism 45 and the component mounting mechanism 54 are controlled so that the dispenser 22 and the unit transferring heads 23, which are operating heads, move up and down based on an approximate height of the operation position derived from the above-mentioned approximate curved surface CS. In other words, the operating heads are made to move up and down by considering an approximate operation position height H1 shown in FIG. 8 (*b*) as the top surface 3*a* of the board 3. In this case, although a difference of only Δh from the real height position of the top surface 3*a* of the board 3 is produced, as described earlier, since the electronic component belongs to the first division (1), because a high precision is not required in the setting of the target position of the downward movement, defects in the operation quality would not occur.

In contrast, when the height precision division of an electronic component 18 which is an operation object belongs to the second division (2), height measuring devices whose objects are the operation positions, namely, the height measuring device 21 of the inspecting and measuring head 7 in the inspecting, measuring and coating device M1, and the height measuring device 25 of the mounting head 13 in the component mounting devices M2 and M3, measure the height of the board respectively, and the respective operation heights are acquired. The coating mechanism 45 and the component mounting mechanism 54 are controlled to make the dispenser 22 and the unit transferring heads 23 which are operating heads to move up and down based on the acquired respective operation position heights. In other words, for the operation positions on the board 3, the direct height measuring devices take the top surface 3*a* as objects of the height measurement and acquire an individual operation position height H2, as shown in FIG. 8 (*b*), so that the above-mentioned difference of Δh is eliminated and an operation quality of high precision can be secured. It is also possible that the individual operation position height H2 measured by the inspecting, measuring and coating device M1 is acquired by the component mounting devices M2 and M3.

In the above-mentioned structure, the inspecting, measuring and coating device M1 and the component mounting devices M2 and M3 as electronic component mounting devices are one device which the electronic component mounting line 1, which is formed by coupling a plurality of electronic component mounting devices, includes. The coating control part 41 and the mounting control part 50, which are operation control parts, derive the approximate operation position height H1 by using the approximate curved surface CS of the top surface 3*a* of the board 3 calculated by the inspecting and measuring part 6 which is the height measuring device which is provided in the electronic component mounting line 1.

The data of the calculated approximate curved surface CS are stored in the storage part 42 as the height measurement data 42*c*, are sent to the administrative computer 30 and are stored as the height measurement data 32*d* in the storage part 32, and are sent to the component mounting devices M2 and M3 and are stored as the height measurement data 51*c* in the storage part 51. In other words, when the height measurement for the calculation of the approximate curved surface CS is performed in the inspecting, measuring and coating device M1 located at the upstream position of the electronic component mounting line 1, it is not necessary to newly perform the height measurement for the calculation of the approximate curved surface CS in the downstream devices.

In the present embodiment, a structure example is shown in which the electronic component mounting devices are so arranged that the board conveying mechanism 2 is hold between the inspecting and measuring part 6 and the resin coating part 8 and between the component mounting parts 10. However, it is also possible that these devices having the above functions are arranged separately in a straight line along the board conveying mechanism 2. When the electronic component mounting line 1 is not formed by a plurality of devices as in the above structure example, or when the inspecting, measuring and coating device M1 and the component mounting devices M2 and M3 are used as an independent device, it is also possible that a height measurement to calculate the approximate curved surface CS of the top surface 3*a* of the board 3 is performed by a height measuring device which each of the devices includes, for example, the height measuring device 25 in the component mounting devices M2 and M3. In this case, the mounting control part 50 derives an approximate operation position height using an approximate formula of the approximate curved surface CS calculated by the component mounting devices M2 and M3. In this case, because a measurement of the individual operation position height may be performed only for the height division 2 for which a high precision is required for up and down movements of the operating head, both the operation quality and the productivity can be improved.

Figure 9:
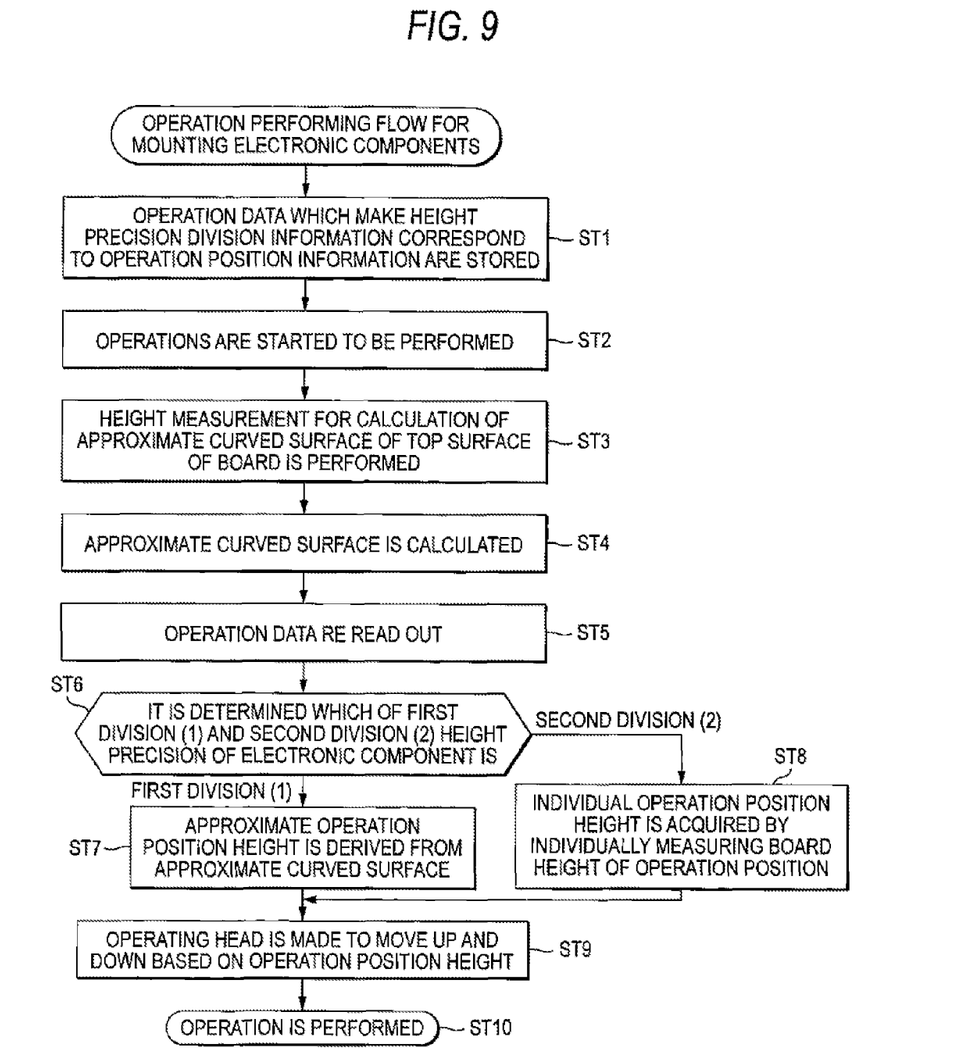
FIG. 9 is a flow diagram which shows an operation performing method for mounting electronic components of the embodiment of the present invention.

Then, the board 3 on which the electronic components 18 are to be mounted is assumed as an object in the electronic component mounting line 1. An operation performing method for mounting electronic components which follows a flow of FIG. 9 is described with reference to respective figures. The operation performing method performs predetermined electronic component mounting operations on every electronic component 18, by making the operating head which is included in the operation performing mechanism to move up and down to the operation position where the operation is performed on the board 3.

First, before the production of one board is started, operation data which make height precision division information correspond to operation position information (referring to FIG. 5) are stored (ST1). In other words, for each of operation positions, operation data which make operation position information indicating the position coordinates in the board 3 of the operation positions to correspond to height precision division information that divide the height precision required for up and down movements of operating heads in the operation into the first division (1) which indicates a normal height precision and the second division (2) which indicates that a high height precision is required based on the type of electronic components beforehand are stored (an operation information storing procedure).

Then, operations are started to be performed (ST2). First, the board 3 is imported into the upstream inspecting, measuring and coating device M1 where a height measurement for the calculation of an approximate curved surface CS of the top surface of the board 3 is performed by making the inspecting and measuring head 7 of the inspecting and measuring part 6 move over the board 3 (ST3). Based on the result of the height measurement, the approximate curved surface CS is calculated by the inspection and measurement control part 40 (ST4). The data of the calculated approximate curved surface CS are stored in the storage part 42 as the height measurement data 42c, are sent to the administrative computer 30 and are stored as the height measurement data 32d in the storage part 32, and are sent to the component mounting devices M2 and M3 and are stored as the height measurement data 51c in the storage part 51.

In the following from (ST5), both of the operations performed by the coating head 9 in the inspecting, measuring and coating device M1, and the operations performed by the mounting head 13 in the component mounting device M2 and M3 are shown. First, the operation data are read out (ST5). In other words, the coating operation data 42b are read out from the storage part 4 in the inspecting, measuring and coating device M1, and the mounting operation data 51a are read out from the storage part 51 in the component mounting devices M2 and M3. The coating control part 41 controls the coating mechanism 45 based on the coating operation data 42b which are read out so that a resin coating operation is performed by the coating head 9, and the mounting control part 50 controls the component mounting mechanism 54 based on the mounting operation data 51a so that a component mounting operation is performed by the mounting head 13 (an operation performing procedure).

In the operation performing procedure, first, it is determined which of the first division (1) and the second division (2) the height precision division of the electronic component as an operation object is with reference to the operation data (referring to FIG. 5) (ST6). Here, when the electronic component as the operation object belongs to the first division (1), an approximate operation height is derived from the approximate curved surface CS described in FIGS. 8 (a) and (b) (ST7). When the electronic component as an operation object belongs to the second division (2), an individual operation position height is acquired by individually measuring the board height of the operation position (ST8). Thereafter, the dispenser 22 in the coating head 9 and the unit transferring head 23 in the mounting head 13 are made to move up and down based on the operation height position, namely, the approximate operation position height H1 or the individual operation position height H2 (ST9). The resin coating operation is performed by the coating head 9, and the component mounting operation is performed by the mounting head 13 (ST10).

In the above-mentioned operation performing method, even if there is a high precision electronic component for which it is required to control in a highly precise way operation heights such as a component mounting height or a coating height of the electronic component which is an operation object, the operating heads can be made to move up and down based on the height precision to be required by each of the electronic components. Therefore, while the decrease of the productivity because it is necessary to individually perform height measurements of the respective operation positions corresponding to the respective electronic components can be prevented, the operation quality can be ensured. Both the operation quality and the productivity can be improved.

This application is based on the Japanese patent application (patent application 2010-240466) filed on Oct. 27, 2010, whose content is incorporated herein by reference.

INDUSTRIAL APPLICABILITY

The electronic component mounting device and the operation performing method for mounting electronic components of the present invention have an effect that both the productivity and the operation quality can be improved, and are useful in the field of electronic component mounting to perform operations by making an operating head move up and down for each electronic component above a board.

DESCRIPTION OF THE SYMBOLS 1 electronic component mounting line
3 board
3a top surface
4 Y axis movable table
5 X axis movable table
6 inspecting and measuring part
7 inspecting and measuring head
8 resin coating part
9 coating head
10 component mounting part
13 mounting head
14 resin adhesive
18 electronic component
18A bump attaching component
18B chip-like component
20 imaging cameras
21 height measuring device
22a coating nozzle
23 unit transfer head
24 board recognition camera
25 height measuring device
M1 inspecting, measuring and coating device
M2, M3 component mounting devices
PR recognition position
PH height measuring point
PD coating position
PM component mounting position
CS approximate curved surface
H1 approximate operation position height
H2 individual operation position height

The invention claimed is:

1. An electronic component mounting device which performs a predetermined operation for mounting each of electronic components on a board on which the electronic components are to be mounted, comprising:
an operating performing mechanism which comprises an operating head that performs the operation and which performs the operation by making the operating head move up and down to operation positions where the operation is performed on the board;
a height measuring device which measures a height position on the top surface of the board at any measurement point;
an operation information storage part which, for each of the operation positions, stores operation data which make operation position information indicating position coordinates in the board of the operation positions to correspond to height precision division information that divide height precision required for up and down movements of the operating head in the operation into a first division which indicates a normal height precision and a second division which indicates that a high height precision is required based on the type of electronic components beforehand; and an operation control part which makes the operating head to perform the operation by reading out the operation data from the operation information storage parts and controlling the operation performing mechanism based on the operation data;

wherein, when the electronic component which is an operation object belongs to the first division, the operation control part controls the operation performing mechanism to make the operating head to move up and down based on an approximate operation position height derived from an approximate curved surface of the top surface of the board which is calculated by using a height measurement result obtained on a plurality of height measuring points on the top surface of the board, and when the electronic component which is an operation object belongs to the second division, the operation control part controls the operation performing mechanism to make the operating head to move up and down based on an individual operation position height obtained when the height measuring device individually measures the board height at the operation position.

2. The electronic component mounting device according to claim 1, wherein the electronic component mounting device is one device which an electronic component mounting line which is formed by coupling a plurality of electronic component mounting devices, comprises, and the operation control part derives the approximate operation position height by using an approximate curved surface of the top surface of the board which is calculated by a height measuring device which is provided in the electronic component mounting line.

3. The electronic component mounting device according to claim 1, wherein the height measuring device in the electronic component mounting device performs a height measurement to calculate an approximate curved surface of the top surface of the board, and the operation control part derives the approximate operation position height by using the approximate curved surface of the top surface of the board which is calculated by the electronic component mounting device.

4. An operation performing method for mounting electronic components which performs a predetermined operation for mounting each of electronic components on a board on which the electronic components are to be mounted by making an operating head which is included in an operation performing mechanism to move up and down to operation positions where the operation is performed on the board, comprising:

an operation information storing procedure of storing, for each of the operation positions, operation data which make operation position information indicating position coordinates in the board of the operation positions to correspond to height precision division information that divide height precision required for up and down movements of the operating head in the operation into a first division which indicates a normal height precision and a second division which indicates that a high height precision is required based on the type of electronic components; and an operation performing procedure of making the operating head to perform the operation by reading out the stored operation data and controlling the operation performing mechanism based on the operation data;

wherein in the operation performing procedures, when the electronic component which is an operation object belongs to the first division, the operating head is made to move up and down based on an approximate operation position height derived from an approximate curved surface of the top surface of the board which is calculated by using the height measurement result obtained on a plurality of height measuring points on the top surface of the board, and when the electronic component which is an operation object belongs to the second division, the operating head is made to move up and down based on an individual operation position height obtained by individually measuring the board height at the operation position.

\* \* \* \* \*